(12) United States Patent
Fan et al.

(10) Patent No.: US 10,115,579 B2
(45) Date of Patent: Oct. 30, 2018

(54) METHOD FOR MANUFACTURING WAFER-LEVEL SEMICONDUCTOR PACKAGES

(71) Applicant: ASM Technology Singapore Pte Ltd, Singapore (SG)

(72) Inventors: Chun Ho Fan, Hong Kong (HK); Teng Hock Kuah, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 15/815,986

(22) Filed: Nov. 17, 2017

(65) Prior Publication Data

US 2018/0151342 A1  May 31, 2018

Related U.S. Application Data

(60) Provisional application No. 62/428,115, filed on Nov. 30, 2016.

(51) Int. Cl.
*H01L 23/00* (2006.01)
*H01L 21/02* (2006.01)
*H01L 21/60* (2006.01)

(52) U.S. Cl.
CPC ........ *H01L 21/02013* (2013.01); *H01L 24/10* (2013.01); *H01L 24/94* (2013.01); *H01L 24/95* (2013.01); *H01L 2021/60022* (2013.01)

(58) Field of Classification Search
CPC ......... H01L 24/10; H01L 24/94; H01L 24/95; H01L 21/02013
See application file for complete search history.

(56) References Cited

U.S. PATENT DOCUMENTS

| 8,018,065 | B2* | 9/2011 | Lam | H01L 21/56 257/620 |
| 8,525,344 | B2* | 9/2013 | Pagaila | H01L 21/561 257/774 |

(Continued)

FOREIGN PATENT DOCUMENTS

| TW | 200743197 A | 11/2007 |
| WO | WO 2010/058646 A1 | 5/2010 |

OTHER PUBLICATIONS

Corrected Written Opinion of the Examination/Search Report dated Feb. 23, 2018 issued in corresponding Philippine Patent Application No. 1/2017/000343.

(Continued)

*Primary Examiner* — Andrew Q Tran
(74) *Attorney, Agent, or Firm* — Ostrolenk Faber LLP

(57) ABSTRACT

During the manufacture of a semiconductor package, a semiconductor wafer including a plurality of bond pads on a surface of the wafer is provided and the surface of the wafer is covered with a dielectric material to form a dielectric layer over the bond pads. Portions of the dielectric layer corresponding to positions of the bond pads are removed to form a plurality of wells, wherein each well is configured to form a through-hole between top and bottom surfaces of the dielectric layer for exposing each bond pad. A conductive material is then deposited into the wells to form a conductive layer between the bond pads and a top surface of the dielectric layer. Thereafter, the semiconductor wafer is singulated to form a plurality of semiconductor packages.

20 Claims, 8 Drawing Sheets

(56) References Cited

U.S. PATENT DOCUMENTS 9,343,333 B2    5/2016  Hunt ............................... 21/568
2006/0246626 A1* 11/2006  Jiang ................... H01L 23/3114
                                                        438/114

OTHER PUBLICATIONS

Taiwan Office Action, dated Mar. 12, 2018, issued in corresponding Taiwanese Patent Application No. 106140020. Total pp. 5 pages.
Examination/Search Report dated Feb. 23, 2018 issued in corresponding Philippine Patent Application No. 1/2017/000343.

* cited by examiner

METHOD FOR MANUFACTURING WAFER-LEVEL SEMICONDUCTOR PACKAGES

FIELD OF THE INVENTION

The invention relates to processes for manufacturing semiconductor packages, and in particular to the packaging of semiconductor dice while they are still part of a wafer.

BACKGROUND AND PRIOR ART

Conventional semiconductor packaging techniques involve mounting semiconductor dice onto device carriers, such as lead frames or laminated substrates, during the packaging process. Although advances in packaging techniques have reduced the form factors of such device carriers such that manufactured packages have outlines that are almost similar to the outlines of the semiconductor dice being packaged (often referred to as "chip-scale packages"), the need to mount the semiconductor die onto a device carrier before packaging it introduces obstacles as to how far the size of the final package is reducible. Other disadvantages include a mismatch between the physical properties of the semiconductor die and the device carrier, giving rise to a higher risk of failure in the assembled packages.

In order to overcome the limitations of conventional semiconductor packaging techniques, it would be beneficial to avoid the need for the semiconductor die to be mounted onto a device carrier during packaging. Thus, the semiconductor dice are packaged while they are still part of the wafer. Such wafer-level packages would offer, amongst other things, the benefits of small size and low inductance.

SUMMARY OF THE INVENTION

It is thus an object of the invention to seek to provide a method for manufacturing semiconductor packages using wafer-level packaging.

Accordingly, the invention provides a method for manufacturing a semiconductor package, comprising the steps of: providing a semiconductor wafer including a plurality of bond pads on a first side of the wafer; covering the first side of the wafer with a dielectric material to form a dielectric layer over the bond pads; removing portions of the dielectric layer corresponding to positions of the bond pads to form a plurality of wells, wherein each well is configured to form a through-hole between top and bottom surfaces of the dielectric layer for exposing each bond pad; depositing a conductive material into the wells to form a conductive layer between the bond pads and a top surface of the dielectric layer; and thereafter singulating the semiconductor wafer to form a plurality of semiconductor packages.

It would be convenient hereinafter to describe the invention in greater detail by reference to the accompanying drawings which illustrate specific preferred embodiments of the invention. The particularity of the drawings and the related description is not to be understood as superseding the generality of the broad identification of the invention as defined by the claims.

BRIEF DESCRIPTION OF THE DRAWINGS

Specific examples of methods of manufacturing semiconductor packages in accordance with the invention will now be described with reference to the accompanying drawings, in which.

DETAILED DESCRIPTION OF THE PREFERRED EMBODIMENTS OF THE INVENTION

FIGS. 1A-1L illustrate a manufacturing process for a semiconductor package according to a first preferred embodiment of the invention wherein a metallic layer, such as a copper layer 20, is formed over an entire surface of a dielectric layer 16 during the process.

Figure 1A:
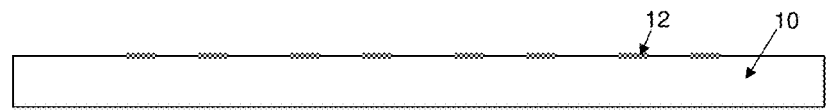
FIGS. 1A-1L illustrate a manufacturing process according to a first preferred embodiment of the invention wherein a metallic layer is formed over an entire surface of a dielectric layer during the process.
Figure 1B:
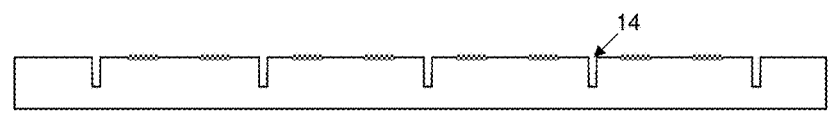
Figure 1C:
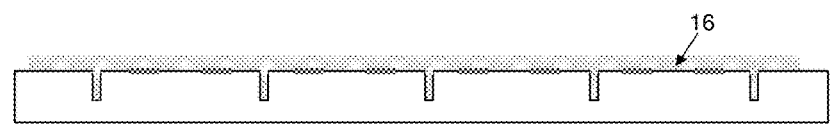

In FIG. 1A, a semiconductor wafer 10 comprising semiconductor dice including bond pads 12 on a first side of the wafer 10 is provided. The wafer 10 is then partially cut to a depth which is less than a thickness of the wafer 10 to form trenches 14, as shown in FIG. 1B. Such trenches 14 may be formed using a standard blade saw or by laser machining. These trenches 14 are preferably formed at positions where semiconductor packages 60 are to be separated in a final product obtained from the process.

After forming the trenches 14, a top or first side of the wafer 10 including the bond pads 12, as well as the trenches 14, are covered and filled by dielectric material to form a dielectric layer 16. The process for forming the dielectric layer 16 may include but is not limited to molding with an epoxy molding compound, spin coating with a liquid spin coated dielectric material, or lamination using a film or sheet of dielectric material. The dielectric material should preferably be capable of photo-imaging so as to facilitate the process of sequentially revealing the bond pads 12 in subsequent steps. The dielectric layer 16 substantially covers the top side of the wafer 10, as well as fill the trenches 14 (see FIG. 1C).

Figure 1D:
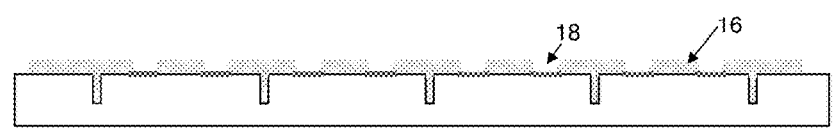

Thereafter, the bond pads 12 covered by the dielectric layer 16 should be exposed by the removal of certain portions of the dielectric layer 16 corresponding to locations of the bond pads 12, such as by drilling through the dielectric material comprised in the dielectric layer 16 (see FIG. 1D). Such removal process to form wells 18 in the dielectric layer 16 may be performed by drilling using laser machining, although other ways of removing the dielectric material to form wells 18 are also possible, such as by selective chemical etching or photo-imaging development processes. Accordingly, each well 18 is configured to form a through-hole between top and bottom surfaces of the dielectric layer 16 for exposing each bond pad 12.

Figure 1E:
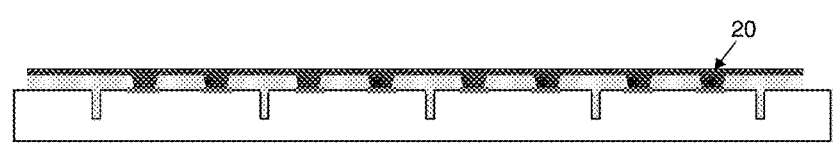

In FIG. 1E, a metallic seed layer (which may comprise a thin copper layer) is formed by physical vapor deposition ("PVD") or electroless deposition on an entire surface of the dielectric material of the dielectric layer 16 and the exposed bond pads 12. Besides copper, the thin layer may also be formed from other metals such as, without limitation, nickel or titanium.

This is followed by depositing a conductive material into the wells 18 to form a conductive layer between the bond pads 12 and the top surface of the dielectric layer 16. This may be achieved by electrolytic copper plating into the wells 18 on the top side of the wafer 10. As a result, a copper layer 20 covers an entire top surface of the dielectric layer 16 and the exposed bond pads 12 at the bottom of the wells 18.

Figure 1F:
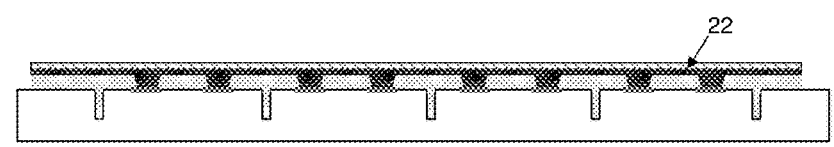
Figure 1G:
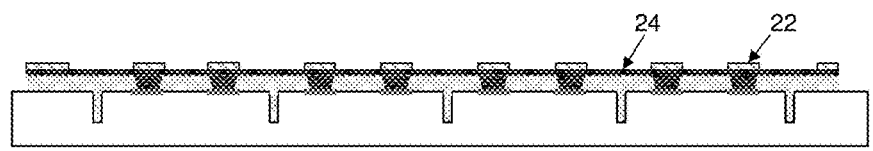

In FIG. 1F, a photo-imageable etch-resist layer 22 is thereafter applied over the whole of the copper layer 20. Such photo-imageable etch-resist layer 22 is used as a mask for subsequent etching of the copper layer 20. Thus, parts of the photo-imageable etch-resist layer 22 are selectively removed, such as by photo-imaging, to develop unmasked portions 24 which expose the copper layer 20 underneath (see FIG. 1G).

Figure 1H:
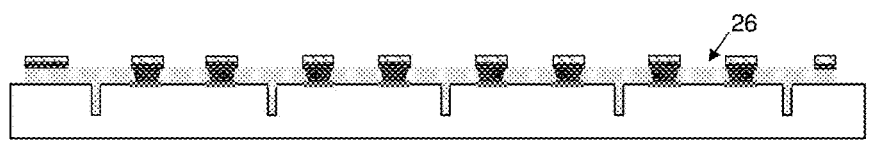
Figure 1I:
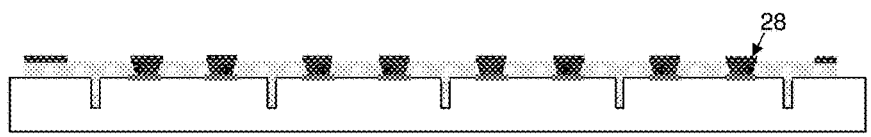

Then, the exposed portion of the copper layer 20 is etched such that copper material located at unmasked portions 24 of the photo-imageable etch-resist layer 22 are etched away to reveal exposed portions 26 of the dielectric layer 16 (see FIG. 1H). After the process of revealing the exposed portions 26 of the dielectric layer 16, the remaining photo-imageable etch-resist layer 22 are further selectively stripped off by suitable means such that only portions of the copper layer 20 deposited into the wells 18 remain, to leave exposed copper studs 28, as shown in FIG. 1I.

Figure 1J:
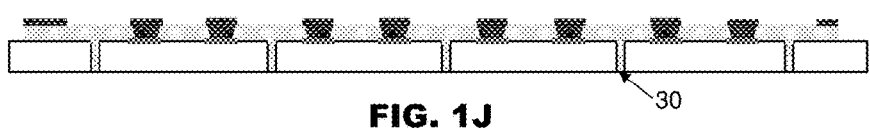

After the exposed copper studs 28 have been formed, material from the bottom side of the wafer 10 is removed by a wafer grinding process, until the thickness of the wafer 10 is reduced to a grinding level 30 which is at a level sufficient to expose a bottom of the dielectric material filled in the trenches 14. As illustrated in FIG. 1J, this grinding process exposes the bottom of the dielectric layer 16 and isolates different parts of the semiconductor dice comprised in the wafer 10 so that they are essentially held together by the dielectric layer 16.

Figure 1K:
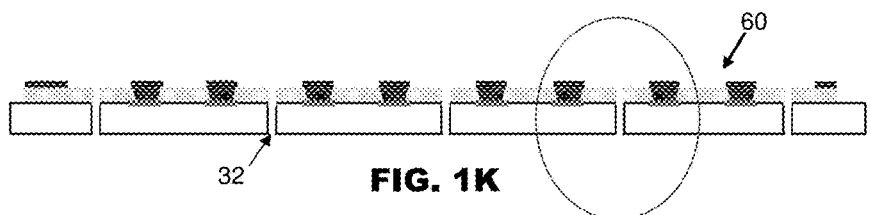

In FIG. 1K, after grinding to the grinding level 30 has been completed, the wafer 10 is singulated along singulation positions 32 corresponding to the trenches 14, which also correspond to where the dielectric layer 16 has been exposed on the bottom side of the wafer 10. Accordingly, the desired final products comprising multiple singulated semiconductor packages 60 are produced.

Figure 1L:
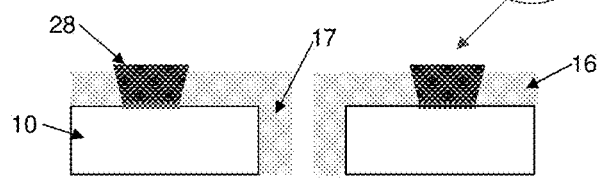

Moreover, by setting the appropriate cutting widths for singulating the wafer 10 along the singulation positions 32 that are less than a width of the trenches 14, one may choose to leave remnants 17 of the dielectric layer 16 along the edges of the semiconductor package 60 after singulation has been completed, as shown in FIG. 1L. The remnants 17 of the dielectric layer 16 would then be adhered to side walls of the semiconductor packages 60 that have been separated.

FIGS. 2A-2K illustrate a manufacturing process according to a second preferred embodiment of the invention wherein a metallic layer 38 is plated up only into wells 18 in a surface of a dielectric layer 16.

Figure 2A:
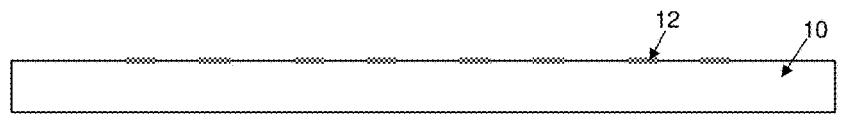
FIGS. 2A-2K illustrate a manufacturing process according to a second preferred embodiment of the invention wherein a metallic layer is plated up only into wells formed in a surface of a dielectric layer.
Figure 2B:
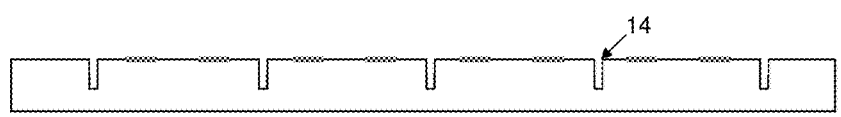

In FIG. 2A, a semiconductor wafer 10 comprising semiconductor dice including bond pads 12 is provided. The wafer 10 is partially cut to a depth which is less than a thickness of the wafer 10 to form trenches 14, as shown in FIG. 2B. Such trenches 14 may be formed using a standard blade saw or by laser machining. These trenches 14 are preferably formed at positions where semiconductor packages 60 are to be separated in a final product obtained from the process.

Figure 2C:
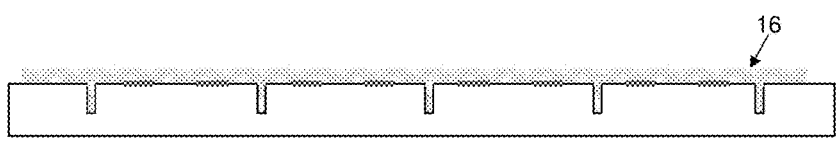

After forming the trenches 14, a top side of the wafer 10 is molded such that a dielectric layer 16 comprising a dielectric material substantially covers the top side of the wafer 10, as well as fill the trenches 14 (see FIG. 2C).

Figure 2D:
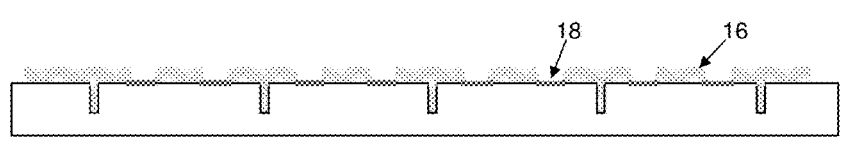

Thereafter, the bond pads 12 should be exposed by the removal of certain portions of the dielectric layer 16 corresponding to locations of the bond pads 12, such as by drilling through the dielectric material comprised in the dielectric layer 16 (see FIG. 2D). Such drilling to form wells 18 in the dielectric layer 16 may be performed using laser machining, although other ways of removing the dielectric material including selective chemical etching or photo-imaging development processes are also possible.

Figure 2E:
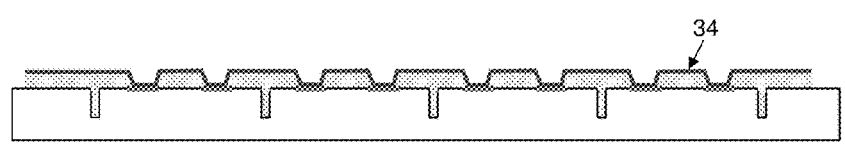
Figure 2F:
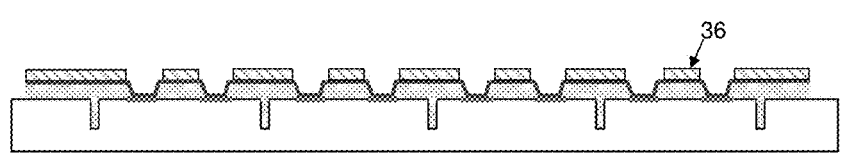

In FIG. 2E, a metallic seed layer 34 (which may comprise a thin copper layer) is formed by PVD or electroless deposition. The metallic seed layer 34 covers the top side and side walls of the dielectric layer 16 as well as the bond pads 12.

Figure 2G:
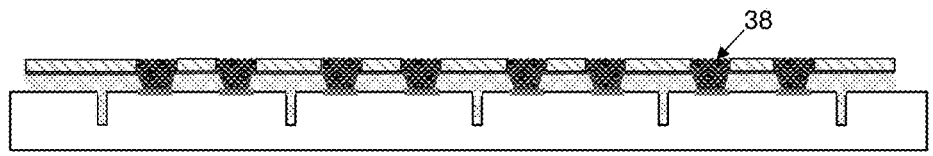

A photo-resist layer 36 is then first applied to cover the whole top surface of the metallic seed layer 34 including the wells. Thereafter, this photo-resist layer will go through an imaging and development process to expose only the areas which are to be plated with copper (see FIG. 2F). The result is that the photo-resist layer 36 is selectively applied over the top surface of the metallic seed layer 34 located on the dielectric layer 16, but not the wells 18. The photo-resist layer 36 is thus used to develop a metal plating pattern. In FIG. 2G, a metallic layer 38, which may comprise copper, is plated into the wells 18, which are not covered by the photo-resist layer 36. The plating-up of the metallic layer 38 enables the metallic layer to form a connection terminal to electrically connect the bond pads 12 to the top surface of the dielectric layer 16.

Figure 2H:
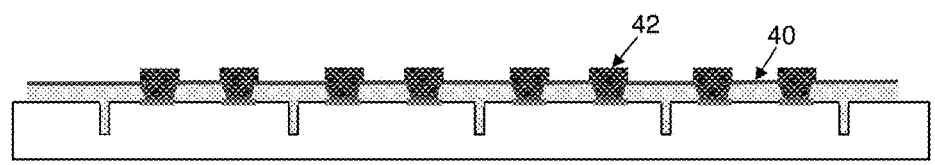
Figure 2I:
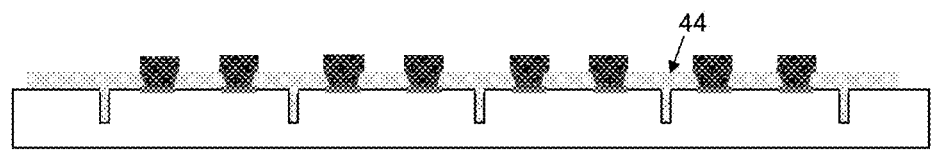

The photo-resist layer 36 is then stripped off as shown in FIG. 2H to reveal exposed metallic seed layer 40 and metallic studs 42 formed from the plating-up step mentioned above. The exposed metallic seed layer 40 is then etched to reveal exposed portions 44 of the dielectric layer 16, as illustrated in FIG. 2I.

Figure 2J:
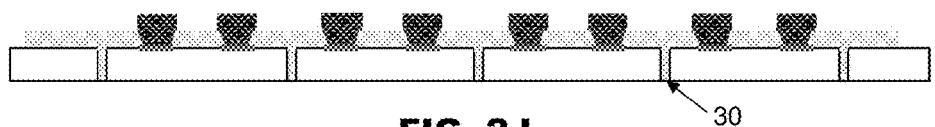

After the exposed metallic layer 38 or studs 42 have been formed, material from the bottom side of the wafer 10 is removed by a wafer grinding process, until the thickness of the wafer 10 is reduced to a grinding level 30 which is at the level of the trenches 14 that were previously formed. As illustrated in FIG. 2J, this grinding process exposes the bottom of the dielectric layer 16 and isolates different parts of the semiconductor dice comprised in the wafer 10 so that they are essentially held together by the dielectric layer 16.

Figure 2K:
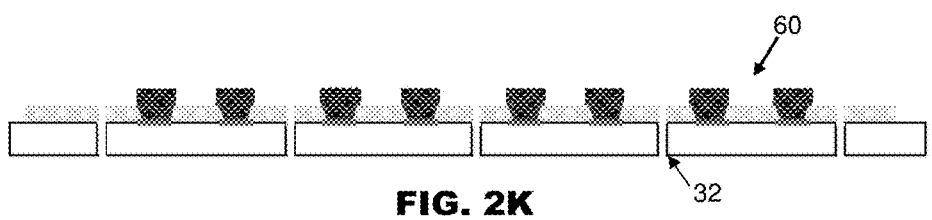

In FIG. 2K, after grinding to the grinding level 30 has been completed, the wafer 10 is singulated along singulation positions 32 corresponding to the trenches 14, which are also where the dielectric layer 16 has been exposed on the bottom side of the wafer 10. Accordingly, the desired final products comprising multiple singulated semiconductor packages 60 are produced.

FIGS. 3A-3L illustrate a manufacturing process according to a third preferred embodiment of the invention wherein metallic contacts 56 are placed onto bond pads 12 of the semiconductor dice during the process.

Figure 3A:
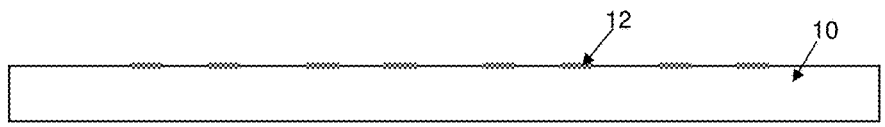
FIGS. 3A-3L illustrate a manufacturing process according to a third preferred embodiment of the invention wherein metallic contacts are placed onto bond pads of the semiconductor dice during the process.
Figure 3B:
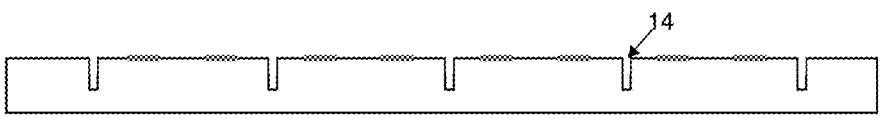

In FIG. 3A, a semiconductor wafer 10 comprising semiconductor dice including bond pads 12 is provided. The wafer 10 is partially cut to a depth which is less than a thickness of the wafer 10 to form trenches 14, as shown in FIG. 3B. Such trenches 14 may be formed using a standard blade saw or by laser machining. These trenches 14 are preferably formed at positions where semiconductor packages 60 are to be separated in a final product obtained from the process.

Figure 3C:
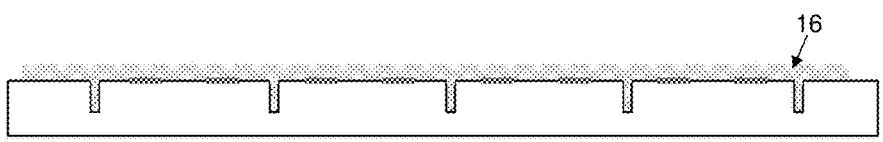

After forming the trenches 14, a top side of the wafer 10 is molded such that a dielectric layer 16 comprising a dielectric material substantially covers the top side of the wafer 10, as well as fill the trenches 14 (see FIG. 3C).

Figure 3D:
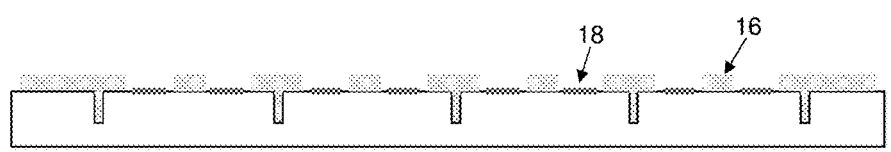

Thereafter, the bond pads 12 are exposed by the removal of certain portions of the dielectric layer 16 corresponding to locations of the bond pads 12, such as by drilling through the dielectric material comprised in the dielectric layer 16 (see FIG. 3D). Such drilling to form wells 18 in the dielectric layer 16 may be performed using laser machining, although other ways of removing the dielectric material are also possible.

Figure 3E:
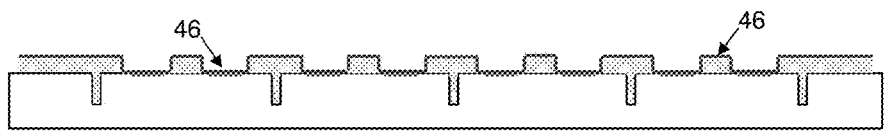

In FIG. 3E, a metallic seed layer 46 (which may comprise a thin copper layer) is formed by PVD or electroless deposition. The metallic seed layer 46 covers the top side and side walls of the dielectric layer 16 as well as the bond pads 12.

Figure 3F:
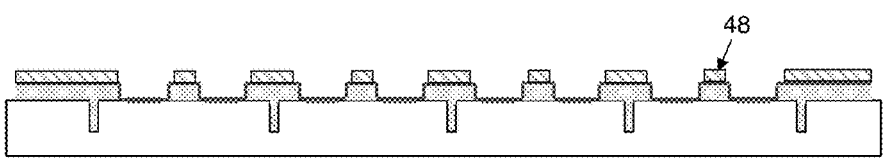
Figure 3G:
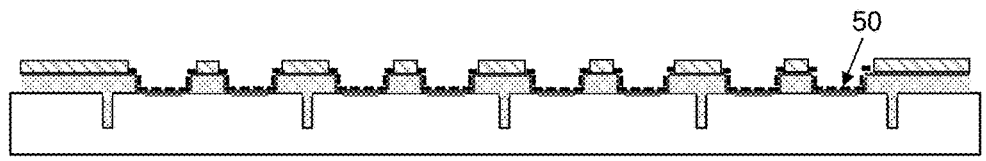

In FIG. 3F, a photo-resist layer 48 is selectively applied over the top surface of the metallic seed layer 46 located on the dielectric layer 16, not including the wells 18. The photo-resist layer 48 is used to develop a metal plating pattern. In FIG. 3G, another thin metallic layer 50, which may comprise copper, is plated onto respective surfaces of the wells 18, which are not covered by the photo-resist layer 48. Different from the process according to the second embodiment of the invention, the thin metallic layer 50 does not fill the whole of the wells 18, but only cover the bond pads 12, the sides of the wells 18 as well as a small area on the top surfaces of the dielectric layer 16.

Figure 3H:
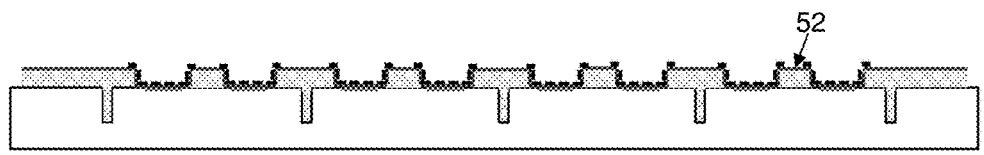
Figure 3I:
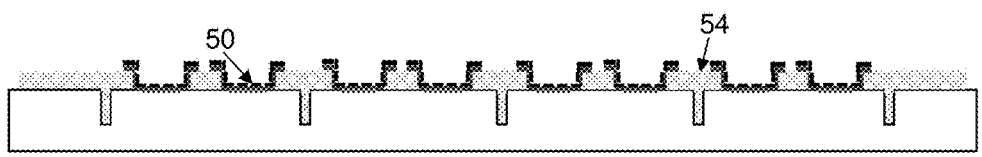

The photo-resist layer 48 is then stripped off as shown in FIG. 3H to reveal an exposed metallic seed layer 52 on the top surfaces of the dielectric layer 16. The exposed metallic seed layer 48 is then etched to reveal exposed portions 54 of the dielectric layer 16, as illustrated in FIG. 3I. After etching away the exposed metallic seed layer, there would still be metallic layers remaining which cover the bond pads 12, side walls of the wells 18 as well as small areas adjacent to the wells 18 on the top surface of the dielectric layer 16.

Thereafter, metallic contacts 56, which may comprise solder, are placed or attached into the wells 18 which have been plated with the thin metallic layer 50. The metallic contacts 56 serve to form a connection terminal to electrically connect the bond pads 12 to the top surface of the dielectric layer 16, and may be in the form of solder balls.

After the exposed metallic contacts 56 have been attached onto the bond pads, material from the bottom side of the wafer 10 is removed by a wafer grinding process, until the thickness of the wafer 10 is reduced to a grinding level 30 which is at the level of the trenches 14 that were previously formed.

Figure 3J:
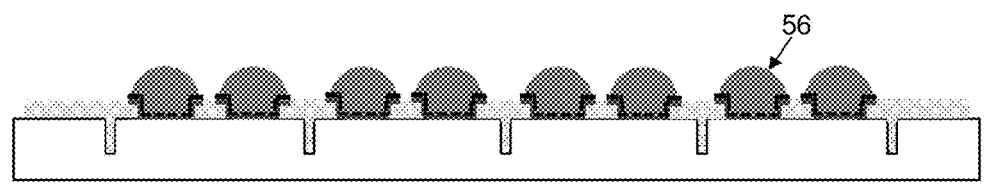

As illustrated in FIG. 3J, this grinding process exposes the bottom of the dielectric layer 16 and isolates different parts of the semiconductor dice comprised in the wafer 10 so that they are essentially held together by the dielectric layer 16.

Figure 3K:
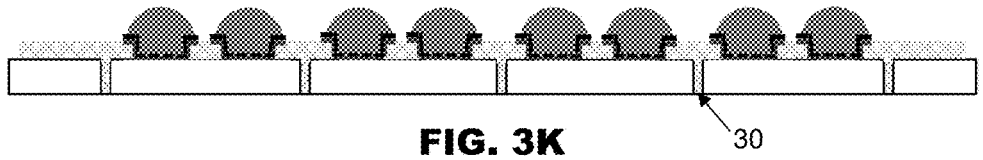
Figure 3L:
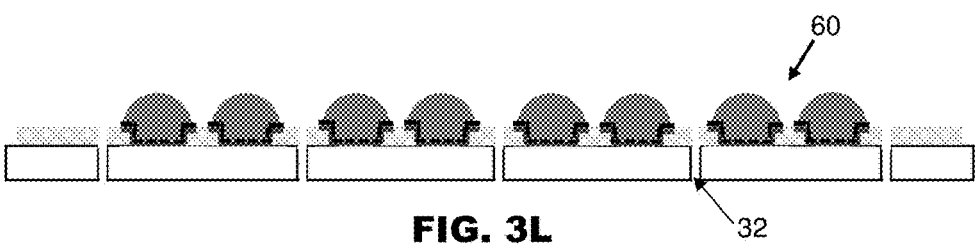

In FIG. 3K, after grinding to the grinding level 30 has been completed, the wafer 10 is singulated along singulation positions 32 corresponding to the trenches 14, which are also where the dielectric layer 16 has been exposed on the bottom side of the wafer 10. Accordingly, the desired final products comprising multiple singulated semiconductor packages 60 are produced.

Figure 4A:
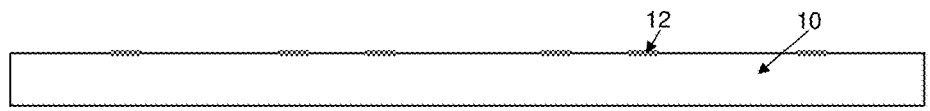
FIGS. 4A-4N illustrate a manufacturing process according to a fourth preferred embodiment of the invention, wherein a back surface of a semiconductor wafer is molded at an early stage of the manufacturing process.
Figure 4B:
Figure 4C:
Figure 4D:
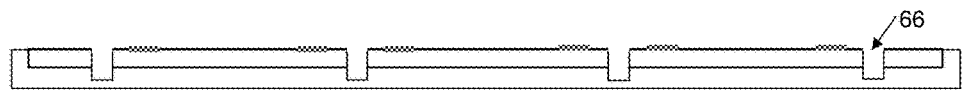
Figure 4E:
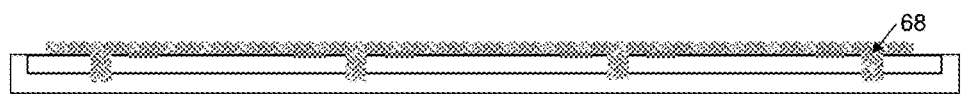
Figure 4F:
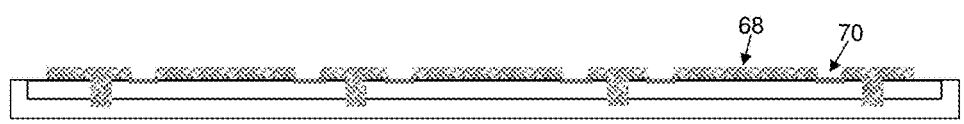
Figure 4G:
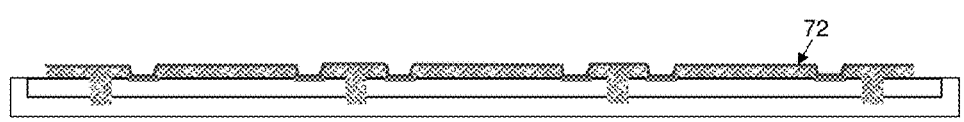
Figure 4H:
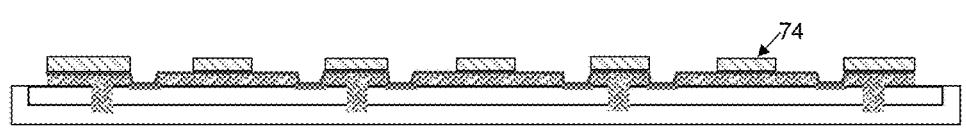
Figure 4I:
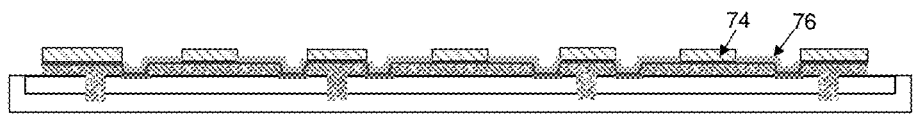
Figure 4J:
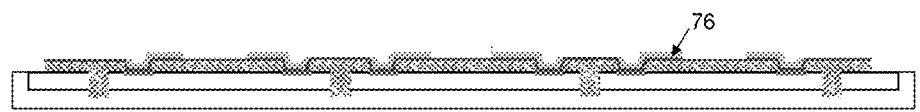
Figure 4K:
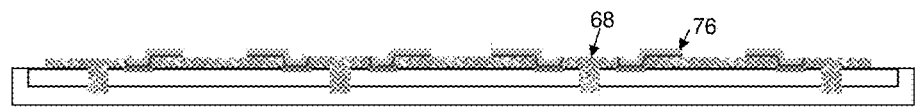
Figure 4L:
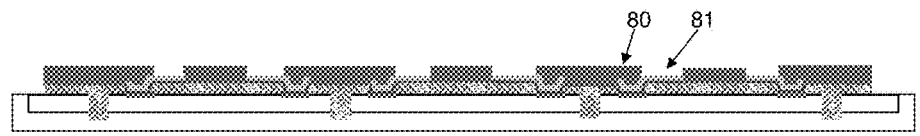
Figure 4M:
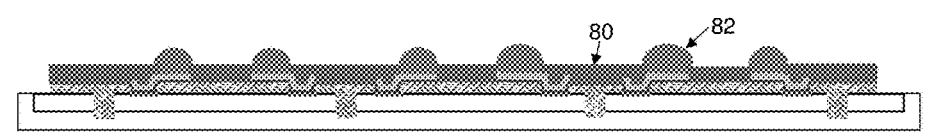
Figure 4N:
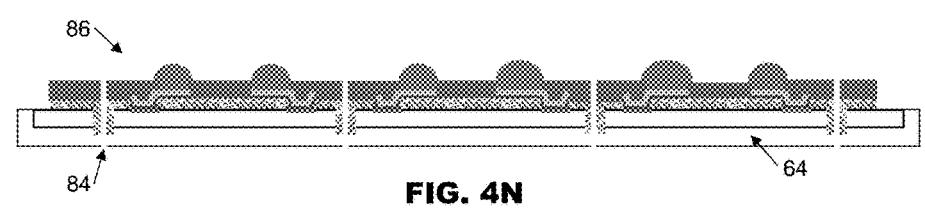

FIGS. 4A-4N illustrate a manufacturing process according to a fourth preferred embodiment of the invention, wherein a back surface of a semiconductor wafer is molded at an early stage of the manufacturing process.

In FIG. 4A, a semiconductor wafer 10 comprising semiconductor dice including bond pads 12 is provided. In FIG. 4B, a back or second side of the wafer 10 (which does not include the bond pads 12) is grinded so that a grinded wafer 62 that results has a thickness that is desired in a final product.

The grinded wafer 62 is then molded such that an entire back or second side of the grinded wafer 62 which is opposite to the first side, as well as the sides of the wafer 10, are covered with a backing molding compound 64 (see FIG. 4C), such as epoxy molding compound.

In FIG. 4D, a top or first side of the molded grinded wafer 62 opposite to the back or second side is partially cut to a depth which extends through the grinded wafer 10 and partially into the backing molding compound 64 to form trenches 66. Hence, portions of the grinded wafer 62 are isolated from one another, although they are still held together by the backing molding compound 64. Such trenches 66 may be formed using a standard blade saw or by laser machining. These trenches 66 are preferably formed at positions where semiconductor packages 86 are to be separated in a final product obtained from the manufacturing process.

After forming the trenches 66, the top or first side of the wafer 10 is molded such that a dielectric layer 68 comprising a dielectric material substantially covers the top or first side of the grinded wafer 62, as well as fill the trenches 66 (see FIG. 4E). Through via or wells 70 are then created in the dielectric layer 68 by the removal of certain portions of the dielectric layer 68 to expose the bond pads 12 which had been covered by the dielectric layer 68 (see FIG. 4F). The wells 70 may be created by a removal process performed on the dielectric layer 68, such as by drilling using laser machining, selective chemical etching, photo-imaging development processes, or other suitable removal processes.

In FIG. 4G, the top sides of the dielectric layer 68 and bond pads 12 are metalized by developing a metallic seed layer 72 comprising a metal, such as copper nickel or titanium. In FIG. 4H, a patterned plating resist layer 74 is formed on top of the metallic seed layer 72. Then, a patterned metallic layer 76, which may comprise copper, is selectively patterned onto the top side of the metallic seed layer 72, as shown in FIG. 4I.

After the patterned metallic layer 76 has been formed, the plating resist layer 74 may be stripped off to form isolated portions of the patterned metallic layer 76 (see FIG. 4J). Thereafter, remnants of the exposed metallic seed layer 72 on the dielectric layer 68 are etched away so as to expose the dielectric layer 68, as shown in FIG. 4K. In FIG. 4L, in preparation for the placement of solder contacts onto ball pads 81 of the patterned metallic layer 76 (corresponding to positions of the bond pads 12), a solder resist layer 80 is coated onto the patterned metallic layer 76 in order to cover the rest of the patterned metallic layer 76 that do not receive the solder contacts. Solder contacts, which may be in the form of solder balls 82, are then attached to the ball pads 81, at areas which are not covered by the solder resist layer 80, as illustrated in FIG. 4M.

Finally, the grinded wafer 62 is singulated along singulation positions 84 corresponding to the trenches 66. Accordingly, the desired final products comprising multiple singulated semiconductor packages 86 having backing molding compound 64 on the back side of the semiconductor packages 86 are produced. Such backing molding compound 64 helps to improve the rigidity of each singulated semiconductor package 86.

It should be appreciated that the manufacturing processes in accordance with the preferred embodiments of the invention form the terminal contacts of the final semiconductor package directly onto the bond pads of the semiconductor dice. This makes the manufacturing process cost-effective, and gives rise to better electrical performance and less electrical interference due to the direct interface.

The invention described herein is susceptible to variations, modifications and/or additions other than those specifically described and it is to be understood that the invention includes all such variations, modifications and/or additions which fall within the spirit and scope of the above description.

The invention claimed is:

1. Method for manufacturing a semiconductor package, comprising the steps of:
   providing a semiconductor wafer including a plurality of bond pads on a first side of the wafer;
   covering the first side of the wafer with a dielectric material to form a dielectric layer over the bond pads;
   removing portions of the dielectric layer corresponding to positions of the bond pads to form a plurality of wells, wherein each well is configured to form a through-hole between top and bottom surfaces of the dielectric layer for exposing each bond pad;
   depositing a conductive material into the wells to form a conductive layer between the bond pads and a top surface of the dielectric layer; and thereafter
   singulating the semiconductor wafer to form a plurality of semiconductor packages.

2. The method as claimed in claim 1, further comprising the step of cutting trenches on the first side of the semiconductor wafer, wherein the step of covering the first side of the wafer with dielectric material further comprises filling the trenches with the dielectric material.

3. The method as claimed in claim 2, wherein the step of singulating the semiconductor wafer further comprises the step of separating the semiconductor packages along the trenches.

4. The method as claimed in claim 2, wherein the dielectric material comprises an epoxy molding compound or a spin coated material.

5. The method as claimed in claim 2, wherein before singulating the semiconductor wafer, grinding a second side of the semiconductor wafer which is opposite from the first side, to a level sufficient to expose a bottom of the dielectric material filled in each trench.

6. The method as claimed in claim 5, wherein a cutting width for singulating the semiconductor wafer is less than a width of the trenches, such that dielectric material is adhered to side walls of the semiconductor packages that have been separated.

7. The method as claimed in claim 1, wherein the removal of portions of the dielectric layer comprises a removal process selected from the group consisting of drilling, etching and a photo-imaging development process.

8. The method as claimed in claim 1, wherein after formation of the wells, further including the step of forming a metallic seed layer on an entire surface of the dielectric material and bond pads before forming the conductive layer.

9. The method as claimed in claim 8, wherein the metallic seed layer comprises a thin layer formed by physical vapor deposition or electroless deposition, and wherein the thin layer comprises a metal in the group consisting of copper, nickel and titanium.

10. The method as claimed in claim 8, wherein the step of depositing the conductive material into the wells comprises depositing the conductive material over an entire surface of the dielectric material including the wells, and thereafter selectively removing the conductive material from the dielectric material such that only portions of the conductive material deposited into the wells remain.

11. The method as claimed in claim 8, further comprising the step of covering surfaces of the dielectric material outside the wells with a photo-resist layer, and thereafter plating a further thin metallic layer onto surfaces of the metallic seed layer comprised in the wells.

12. The method as claimed in claim 11, wherein the further thin metallic layer covers the bond pads and side walls of the wells, and small areas of surfaces of dielectric material outside the wells.

13. The method as claimed in claim 12, wherein the step of depositing the conductive material into the wells comprises the step of attaching metallic contacts onto areas plated with the further thin metallic layer.

14. The method as claimed in claim 13, wherein the metallic contacts comprise solder balls.

15. The method as claimed in claim 1, further comprising the step of grinding a second side of the semiconductor wafer opposite to the first side, prior to forming the dielectric layer over the bond pads.

16. The method as claimed in claim 15, further comprising the step of molding the second side of the semiconductor wafer with a backing molding compound, prior to forming the dielectric layer over the bond pads.

17. The method as claimed in claim 16, further comprising the step of cutting trenches on the first side of the semiconductor wafer, wherein the trenches extend through the semiconductor wafer from the first side and partially into the backing molding compound, and wherein the step of covering the first side of the wafer with dielectric material further comprises filling the trenches with the dielectric material.

18. The method as claimed in claim 17, wherein after formation of the wells, further including the step of forming a metallic seed layer on an entire surface of the dielectric material and bond pads before forming the conductive layer.

19. The method as claimed in claim 18, further comprising the step of forming a patterned metallic layer onto the metallic seed layer before forming the conductive layer.

20. The method as claimed in claim 19, further comprising coating a solder-resist layer onto the patterned metallic layer, and wherein the step of depositing the conductive material into the wells comprises the step of thereafter attaching solder contacts to areas which are not coated with the solder-resist layer.

* * * * *